United States Patent [19]

Shimomoto et al.

[11] 4,430,185
[45] Feb. 7, 1984

[54] METHOD OF PRODUCING PHOTOELECTRIC TRANSDUCERS

[75] Inventors: Yasuharu Shimomoto; Toshihisa Tsukada; Akira Sasano, all of Tokyo; Yasuo Tanaka, Kokubunji; Hideaki Yamamoto; Yukio Takasaki, both of Hachioji, all of Japan

[73] Assignee: Hitachi, Ltd., Tokyo, Japan

[21] Appl. No.: 245,749

[22] Filed: Mar. 20, 1981

[30] Foreign Application Priority Data

Mar. 24, 1980 [JP] Japan .................. 55-36056

[51] Int. Cl.³ .......................................... C23C 15/00
[52] U.S. Cl. ...................... 204/192 P; 204/192 C; 204/192 S; 204/192 EC; 427/39; 427/74; 427/86; 136/258
[58] Field of Search ........... 204/192 P, 192 C, 192 S, 204/192 EC; 427/39, 74, 86; 136/258 AM

[56] References Cited

U.S. PATENT DOCUMENTS

| | | | |
|---|---|---|---|
| 3,983,022 | 9/1976 | Anyang et al. | 204/192 |
| 4,025,339 | 5/1977 | Kuehnle | 204/192 P |
| 4,064,521 | 12/1977 | Carlson | 136/258 AM |
| 4,065,600 | 12/1977 | King et al. | 204/192 P |
| 4,086,555 | 4/1978 | Krikorian et al. | 204/192 P |
| 4,116,791 | 9/1978 | Zega | 204/192 N |
| 4,117,506 | 9/1978 | Carlson | 357/30 |
| 4,173,661 | 11/1979 | Bourdon | 204/168 |

FOREIGN PATENT DOCUMENTS

| | | | |
|---|---|---|---|
| 31731 | 8/1981 | European Pat. Off. | 136/258 AM |
| 1209408 | 4/1972 | United Kingdom . | |
| 2029642 | 3/1980 | United Kingdom . | |

OTHER PUBLICATIONS

Thin Film Processes, Ed. by John L. Vosseu et al., Academic Press, 1978, pp. 12, 13, 20, 24-28, 50-58.

Primary Examiner—Veronica O'Keefe
Attorney, Agent, or Firm—Antonelli, Terry & Wands

[57] ABSTRACT

In the method of producing photoelectric transducers having processes for forming a photoconductive layer on a predetermined substrate with an irregular surface by a method of depositing the photoconductive layer in the atmosphere including at least plasma, the predetermined substrate with irregular surface is disposed above a first electrode to which an electrode is opposed, and said photoconductive layer is formed while a negative potential is being applied to the first electrode. This enables the photoconductive layer to be formed without breaks at steps, pinholes and so on due to the irregular surface, and therefore, it is possible to provide good photoelectric transducers with small dark current.

21 Claims, 14 Drawing Figures

METHOD OF PRODUCING PHOTOELECTRIC TRANSDUCERS

This invention relates to an improvement of a photoelectric transducer or solid state image pickup device formed by a photoconductive layer on a semiconductor substrate.

The principle of the solid state image pickup device is that a plurality of picture elements each having at least a photoelectric transducing portion are arranged in a matrix shape and information at each picture element is read by an XY address system.

The photoelecric transducing portion of each element is constructed by, for example, directly forming impurity diffused regions in a silicon substrate, or using a photoconductive layer thereon.

In an example of using a photoconductive film, a scanning circuit with, for example, MOS transistors and so on for XY addressing is formed in a silicon (Si) substrate and then a photoconductive layer is formed on the upper layer of the silicon substrate to build up a light receiving portion. Such a solid state image pickup device is seen in Japanese Patent Laid-Open (Kokai) No. 95720/1976, International Electron Devices Meeting, December, 1979, p. 134 to 136, and so on. Moreover, a solid state image pickup device utilizing hydrogenated amorphous silicon for photoconductive layer is disclosed in U.S. Pat. Application Ser. No. 66,230 filed Aug. 13, 1979.

The basic idea of this invention is that when a photoconductive layer is deposited on a semiconductor substrate in which a predetermined scanning circuit or the like is formed, by reactive sputtering or glow discharge CVD (chemical vapor deposition) in an atmosphere containing a plasma, a negative bias voltage is applied to the above semiconductor substrate. As a result a photoconductive layer is smoothly deposited over an irregular, or uneven surface of the semiconductor substrate, without causing cracks or disconnections therein.

In other words, this invention proposes a method of producing a photoelectric transducer, characterized in that in an atmosphere containing a plasma, a predetermined substrate is placed on a holder serving as a first electrode to which a second electrode is opposed, and a photoconductive layer is deposited on the substrate with a negative bias potential being applied to the holder electrode.

The present invention will be apparent from the following detailed description taken in conjunction with the accompanying drawings, in which.

Figure 2:
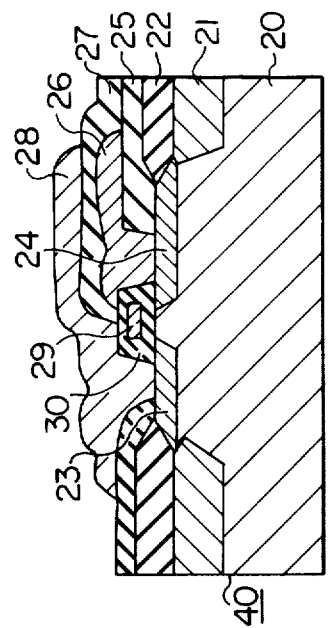
FIG. 2 is a cross-sectional view of a semiconductor substrate.
Figure 3:
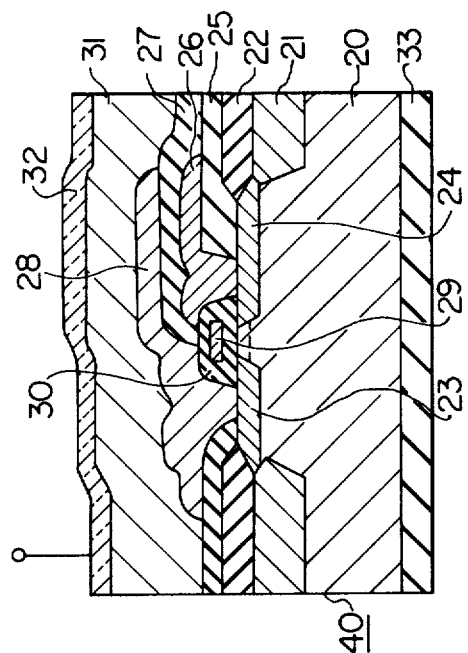
FIG. 3 is a cross-sectional view of a picture element of a solid stage image pickup device using a photoconductive layer.
Figure 1:
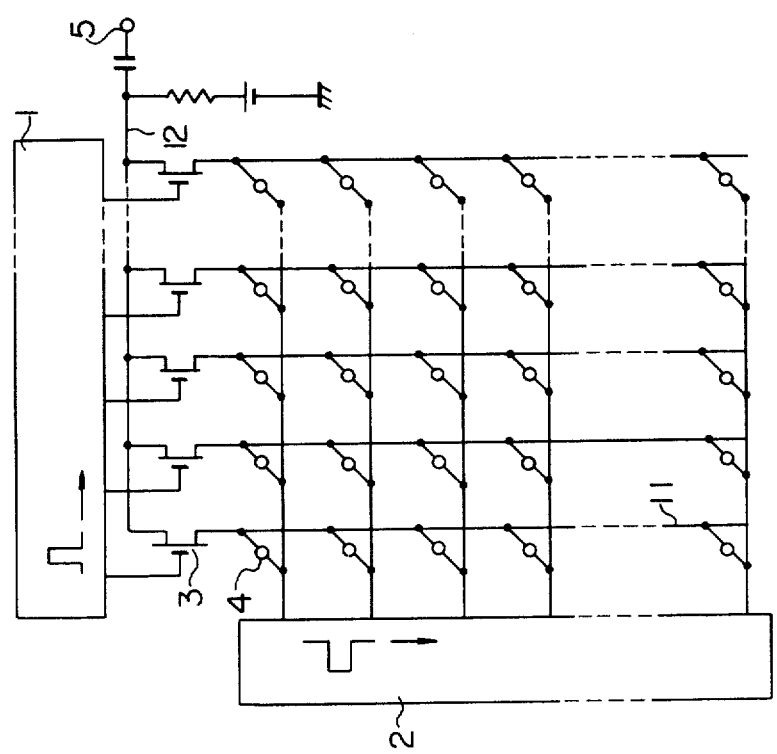
FIG. 1 is a schematic diagram showing the principle of a solid state image pickup device.

Referring to FIG. 1, the principle of the solid state image pickup device will be described. Picture elements 4 are arranged in a matrix pattern and read from one by one by an XY address system. The selection of each picture element is performed by a horizontal scanning signal generator 1 and a vertical scanning signal generator 2. Reference numeral 3 represents an, e.g., MOS switch connected to each picture element, and 5 an output terminal. FIG. 2 is a schematic cross-section of a picture element to which reference is made in explaining the principle of the solid state image pickup device using a photoconductive layer. Diffused regions 23 and 24 are provided in a, e.g., p-type silicon substrate 20 to serve as a source and drain of the MOS switch. Reference numeral 29 represents a gate electrode of the MOS switch, 26 a drain electrode thereof from which a signal is taken out, and 28 a source electrode thereof. On the top surface of such a switch circuit are formed a photoconductive thin film 31 and a transparent electrode 32 as shown in FIG. 3. The details of FIG. 2 will be described later. Although CCD (charge coupled device) or the like is formed in a silicon substrate for a scanning circuit as in the prior art, this invention can be applied to the scanning circuit independently of its construction.

The electrode 28 is opposed via the photoconductive film 31 made of photoconductive substance such as $Sb_2S_3$, CdS, $As_2Se_3$, or polycrystalline silicon, to the transparent conductive film 32 to form a capacitor C, the magnitude of which is proportional to the area S of the electrode. Since the electrodes are separately arranged in a matrix pattern, the capacitors formed between electrodes are in a matrix shape. These capacitors each including a photoconductive thin film 31, serve as photosensitive elements, i.e., picture elements. The photosensitive elements can be replaced by an equivalent circuit which is a parallel circuit of a capacitor C and a variable resistor R depending on the light intensity.

When an optical image is focused via a lens onto the surface of the photoconductive layer, the resistances of the photoconductive film are changed in value in proportion to the light intensity of each part of the optical image. Consequently, at one end 7 of the vertical switch 4 appears a voltage change corresponding to the optical image. This voltage variation is derived through signal output lines 11 and 12 from the output terminal 5, as a video signal.

However, such a photoelectric transducer as described above has a greatly irregular (that is non-flat) surface on which a photoconductive film is formed. This is because MOS transistors, CCD or the like are fabricated in the silicon substrate as described previously. The surface irregularity is 1.5 μm, at maximum.

The photoconductive film is generally formed by vacuum evaporation, sputtering evaporation, reactive sputtering, glow discharge CVD, or the like, but it is affected by the irregularity of the surface on which the photoconductive film is formed to produce many cracks and pinholes, particularly around irregular surface portions. Thus, the solid state imager with such a light receiving surface will provide a formed image having a great number of flaws or defects, thus exhibiting extremely poor picture quality. In the worst case, a short circuit may occur between the transparent electrode on the photoconductive film and the lower electrode on the silicon substrate.

Figure 4:
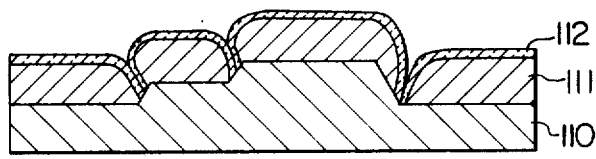
FIG. 4 is an explanatory diagram showing the state of a photoconductive layer deposited by a conventional method.

FIG. 4 illustrates this condition. Here, reference numeral 110 represents a semiconductor substrate in which switching elements and scanning circuits are formed. The irregularities on the substrate are due to surface geometry of built in semiconductor elements stated above, including their wirings and lead conductors. If a photoconductive film 111 is deposited on the irregular surface by the normal process, discontinuous points will easily occur, particularly at steps of the semiconductor substrate as shown in FIG. 4 at the layer 111. Therefore, when a transparent electrode 112 is formed on the photoconductive layer 111, the lower electrodes exposed on the substrate will be apt to contact the transparent electrode.

This invention proposes to obviate the above drawbacks.

The reason why the method of the invention is effective to restrict the occurrence of cracks and pinholes of the deposited photoconductive film at the steps or surface irregularities of the substrate, will now be described briefly.

Figure 5:
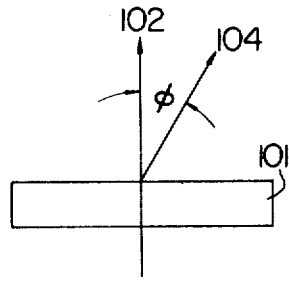
FIG. 5 is a diagram showing the relation between the substrate and sputtered particles.
Figure 6:
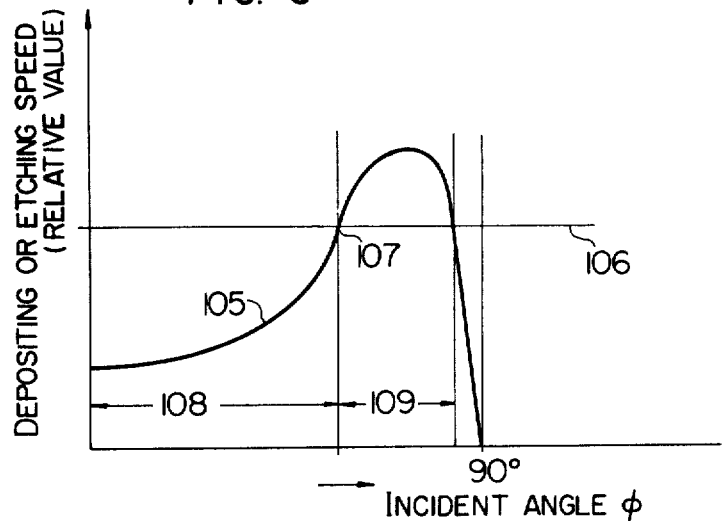
FIG. 6 is a graph showing the relation between the incident angle of particles and etching speed.
Figure 7:
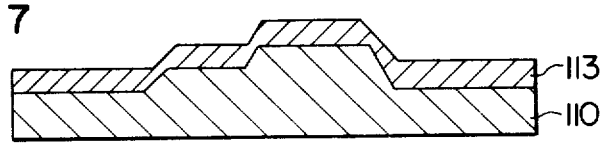
FIGS. 7 to 9 and 11 are explanatory diagrams showing the deposited state by the method of the invention.
Figure 8:
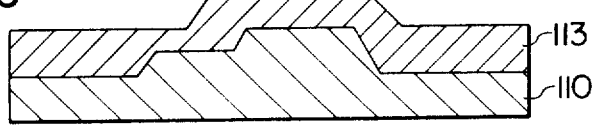
Figure 9:
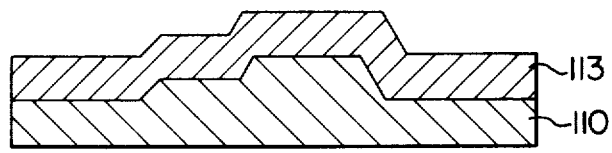

FIG. 5 shows the relation between a sample 101 to be sputtered on and incident particles 104. It indicates a condition in which particles 104 are incident on the sample 101 at angle $\phi$ (incident angle) with respect to the normal 102 to the sample surface. FIG. 6 shows the relation between the sputter etching speed and incident angle ($\phi$) of particles, by a curve 105. A straight line 106 represents the depositing speed of particles to be deposited onto the substrate. If a bias voltage is applied to the substrate holder, the relative speed 105 at which the deposited film is sputter-etched, intersects the depositing speed 106 of particles onto the substrate at 107, so that two regions 108 and 109 are produced with the boundary at the intersection. In other words, in a major large-$\phi$ region 109, the etching speed is higher than the depositing speed. Therefore, the resulting depositing speed is remarkably reduced on the slopes formed between steps on the substrate. As a result, deposition of photoconductive material along the slope proceeds depending substantially upon the deposition on the lower flat level. This prevents the layer from cracking at the steps. FIGS. 7 to 9 show such state of deposition: FIG. 7 shows the initial state, FIG. 8 the midway state and FIG. 9 the completed state. Although the reason why the photoconductive film is smoothed has been described for the sputtering method, such as an ion plating method, the photoconductive film can be smoothed by the same mechanism for other methods to which this invention can be applied.

This invention will hereinafter be described for the case where an amorphous silicon containing hydrogen is used as the photoconductive film. Of course, other photoconductive films can be deposited in the atmosphere containing plasma by the method of this invention: for example, various kinds of chalcogen compounds.

A silicon substrate in which switching circuits, scanning circuits and the like are formed, is first prepared. The switching circuits and so on are satisfactorily formed in the semiconductor substrate by the normal process for semiconductor devices.

FIG. 2 is a cross-section of the semiconductor substrate of a photoelectric transducer using a MOS field effect transistor as a switching element for one picture element region. Reference numeral 21 represents an impurity doped region provided for good isolation between elements, 22 an insulating film such as $SiO_2$, 25 an insulating film such as $SiO_2$, 27 an interlayer insulating film and 30 a gate insulating film.

In order to deposit a semiconductor film, a semiconductor substrate 40 prepared is as indicated in FIG. 2 placed on a substrate holder of a sputtering apparatus, and a bias voltage is applied to the substrate holder. Under such bias voltage, a photoconductive film 31 is formed by the sputtering method. The thickness of the photoconductive film 31 is generally in the range from 0.5 to 4 $\mu$m, preferably about from 1.5 to 3.0 $\mu$m. Thereafter, a transparent electrode 32 is formed on the photoconductive film 31. The transparent electrode 32 constitutes a second electrode on the other surface of the semiconductor substrate, thus fabricating a photoelectric transducer FIG. 3. The transparent electrode 32 is formed by depositing a film of indium oxide and tin oxide to about 150 $\mu$m thickness, or a very thin film of gold or the like or metal strip film. On a part of the transparent electrode but not the light receiving portion is evaporated via a mask, Cr-Au compound, and to the evaporated area is wire-bonded a biasing electrode. Thus, a solid-state image pickup device is completed. FIG. 3 is a cross-section of a portion of this image pickup device.

The sputtering process using biasing according to the invention will be described below.

The amorphous silicon containing hydrogen has the following constituents.

It contains 50-atom percent or more silicon and 5-to-50 atom percent hydrogen. The hydrogen content is preferably 5 to 30 atom percent. The silicon may be replaced by Ge or C to about 30% in general. The thickness of the photoconductive layer is generally from 0.5 $\mu$m to 4 $\mu$m.

Of course, an impurity is added as necessary.

The hydrogen containing amorphous silicon film is formed by the reactive sputtering method as follows. A molten silicon or crystalline silicon is used as a target. In an atomsphere of the mixture of an inert gas, generally argon (Ar) and a necessary amount of $H_2$ gas, glow discharge is caused by direct current or high frequency. Argon ions ($Ar^+$) are bombarded against the target in the glow discharge, with silicon from the target to be deposited on the substrate opposite to the target. Silicon atoms ejected from the target react with hydrogen atoms H to form a desired amorphous silicon film containing hydrogen on the substrate. Another inert gas Ne, Kr, or Xn and $PH_3$ or $B_2H_5$ gas gas may be used instead of Ar and $H_2$. The discharge gas pressure is selected to be in the range from $8 \times 10^{-5}$ to $5 \times 10^{-2}$ Torr. For stable discharge it is preferred to select the range from $1 \times 10^{-4}$ to $1 \times 10^{-2}$ Torr.

The substrate temperature during the operation of deposition may be a temperature at which the general sputtering is performed. For the hydrogen containing silicon, selection is made between 50° and 300° C., and it is preferred to select between 150° and 250° C. Selection of too low a temperature will cause unstable coupling between Si and H is the hydrogen-containing silicon film, resulting in deterioration of the photoconductive characteristics.

In this invention, a negative potential is essentially applied to the substrate holder.

Figure 10:
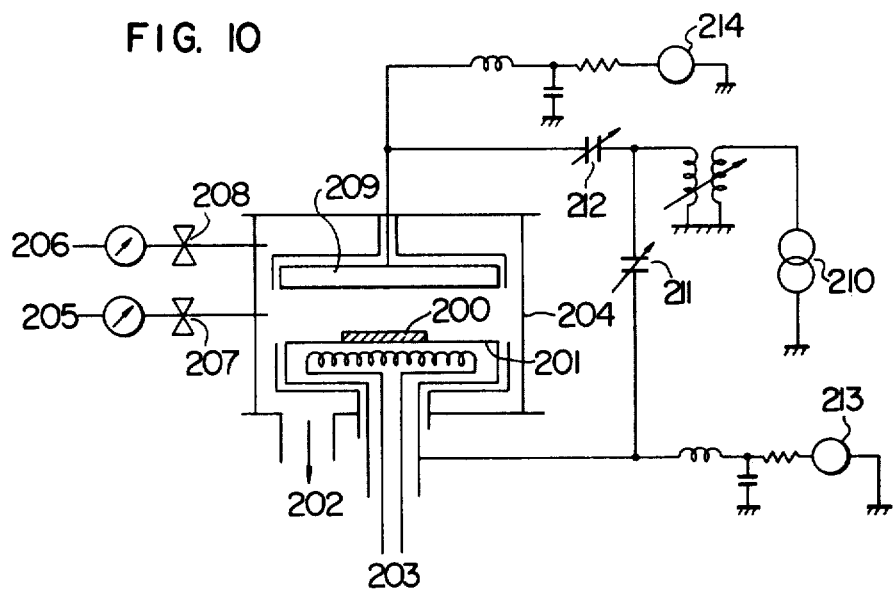
FIG. 10 is a schematic diagram of a sputtering apparatus.

FIG. 10 is a schematic diagram useful for explaining a bias sputtering apparatus. Reference numeral 204 represents a vacuum container generally called a sputter chamber. The air of the sputter chamber is exhausted from an exhaust port 202 to less than $1-10^{-6}$ Torr at most. After exhaustion of air, argon and hydrogen are supplied from gas flow inlets 205 and 206 via gas control valves 207 and 208 to the sputter chamber respectively. Reference numeral 209 represents a target to be sputtered to and this target 209 is opposed to a substrate holder 201. Reference numeral 203 represents substrate heating means such as a heater, and 200 is a semiconductor substrate as a sample. During sputtering, the substrate holder 201 and target 209 are supplied with a high-frequency power. Usually, the high frequency power from a high frequency power source 210 (generally 13.56 MHz) is applied to the substrate holder 201 and the target 209 via a power matching transformer 215 and capacitors 211 and 212. The power to be supplied is selected to be in the range from 0.1 to 10 watt/cm$^2$, and the ratio of power to be supplied to the substrate to the target is generally in the range from 1/1 to 1/10. If the ratio is selected to be in the range from 1/6 to 1/10, the thickness of the photoconductive film is more uniform as shown in FIG. 9, in which a uniform-thickness photoconductive film 113 is formed on the semiconductor substrate 110. In this case, an electric field to be established across the photoconductive film 113 when the solid state image pickup device operates is satisfactorily uniform in the photoconductive film. The ratio of the voltages to be supplied is usually selected to be 1/6 or 1/8.

Figure 11:
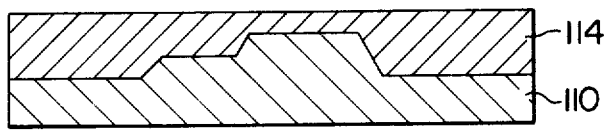

On the other hand, as the voltage ratio approaches 1/1, the surface itself of the photoconductive film becomes flat from the macrostandpoint, as shown in FIG. 11, in which a photoconductive film 114 of flat surface is formed on the semiconductor substrate 110. However, when a voltage is applied to the photoconductive film 114, through a transparent electrode thereon the electric field strength at each position is different due to non-uniform thickness of the film.

Reference numerals 213 and 214 designate voltmeters for the substrate holder and target, respectively. To the substrate holder is applied a voltage usually in the range from $-5$ V to $-300$ V. For example, under the conditions of a discharge power of 2 W/cm$^2$, a hydrogen partial pressure of $5\times10^{-4}$ Torr in the atmosphere, an argon partial pressure of $2\times10^{-3}$ Torr and a biasing voltage of $-50$ V to the sample holder, a hydrogenated amorphous silicon layer of about 3 $\mu$m is formed in three hours.

Figure 12:
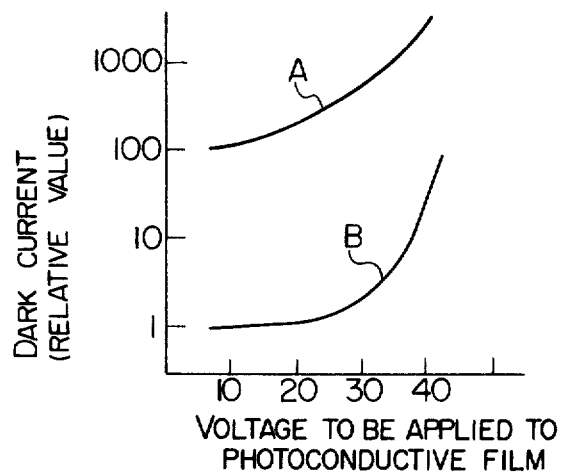
FIG. 12 shows dark current characteristics.

FIG. 12 shows dark current characteristics in a photoelectric transducer according to the invention and a conventional counterpart: Curve A indicates the conventional and curve B the invention. The photoconductive film is an amorphous silicon containing hydrogen (15%) and the thickness is 2.0 $\mu$m. From the figure it will be seen that the photoelectric transducer fabricated according to the invention is very excellent in the dark current characteristic. This is chiefly because the cracks of the photoconductive film at the step have been obviated.

Figure 13:
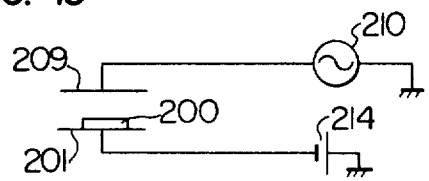
FIG. 13 is an explanatory diagram showing the way in which DC bias voltage is applied.

The reactive sputtering may be made by DC (direct current) instead of RF sputter. For this DC reactive sputtering a voltage of about $-2$ to $-7$ kV is applied to the target. The other things may be considered substantially the same as above. FIG. 13 shows a way of applying DC bias. Several reference numerals represent the same components as in FIG. 10.

In order that the photoconductive film of the photoelectric transducer (or solid state image pickup device) has a requisite thickness for flat surface, it is unnecessary to make full use of the method of the invention. For example, the method of this invention can be utilized for the first part of the thickness of the photoconductive film, as a sputtered film for deposition enough to flatten the sides of the underlying irregularlities, and then the other part of the thickness of the photoconductive film is grown as a second layer by a conventional deposition method for the consideration of photoconductive characteristics. In this case, the necessary film thickness to be obtained by the method of the invention is in the range from 0.5 to 2.0 $\mu$m.

On the contrary, part of the thickness of the complete photoconductive film may be achieved on the semiconductor substrate by the normal method and then the other part of the thickness by the method of the invention. Of course, the photoconductive film may be in three or more layers in order to attain the complete thickness, but the photoconductive film must be deposited to a thickness of 0.5 to 2.0 $\mu$m by the method of the invention.

Figure 14:
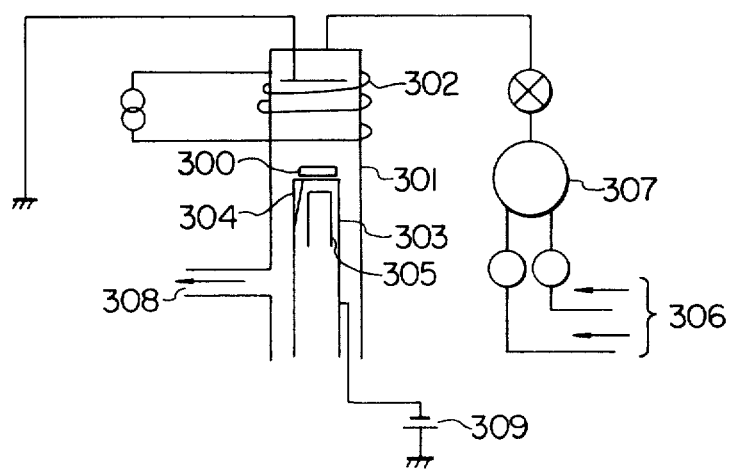
FIG. 14 is a schematical diagram of a glow discharging apparatus.

The method of depositing photoconductive film on a substrate to which a bias is applied may be utilized for the case where a hydrogen containing silicon film is formed by decomposition of SiH$_4$ or the like in the glow discharge. FIG. 14 shows an example of using the glow discharge. Reference numeral 300 denotes a sample, 301 a container which can be evacuated to a vacuum, 302 an RF coil, 303 a sample holder, 304 a temperature measuring thermocouple, 305 a heater, 306 an inlet through which an atmosphere gas such as SiH$_4$ or the like is introduced, 307 a tank for mixing gases and 308 a connection to an exhaust system. The method utilizing decomposition due to glow discharge may be a normal one. Numeral 309 represents a power supply for supplying a bias to the substrate. This biasing has an effect similar to that in the sputtering method.

Ar gas and SiH$_4$ gas are introduced into the vacuum chamber. However, Ar gas need not necessarily be used. When Ar gas is used, the ratio of SiH$_4$ gas to Ar gas is 10 vol.% or more, and the gas pressure of the raw material gas is in the range between $10^{-2}$ to 3 Torr. The substrate is maintained at a temperature of 200° C. and normally a high frequency of 0.2 to 30 MHz is applied to cause glow discharge in the atmosphere so that the hydrogen containing silicon film is formed on the substrate to a thickness of 2.0 $\mu$m. The subsequent processes are similar to the above example. Also in this case, a bias of $-50$ V is applied to the substrate to enable an excellent hydrogenated amorphous silicon layer to be formed, and thus a photoelectric transducer with a small dark current can be realized.

What is claimed is:

1. A method of producing a photoelectric transducer including depositing a photoconductive layer of amorphous hydrogenated silicon on a predetermined substrate having an irregular surface including non-flat portions, said predetermined substrate being a semiconductor substrate comprising at least an impurity-doped region, an electrode contacting at least part of said impurity-doped region, and a predetermined insulating material layer thereby constituting semiconductor switch elements and interconnections therebetween for a photoelectric transducer, in an atmosphere containing a plasma, comprising the steps of:
   placing said predetermined substrate with an irregular surface on a first electrode such that said irregular surface is exposed, said first electrode constituting a holder for said predetermined substrate;
   providing a second electrode as a target to oppose said first electrode; and
   performing at least part of said depositing a photoconductive layer of amorphous hydrogenated silicon on the predetermined substrate with a negative bias potential of −5 V to −300 V being applied to said first electrode, and a ratio of power to be supplied to the substrate and the target being in the range of between 1/1 and 1/10, wherein the application of said negative bias voltage to said first electrode acts to sputter-etch a film deposited on said non-flat surface differentially from that on the flat surface to thereby produce a crack-free and pinhole-free photoconductive film of amorphous hydrogenated silicon on the substrate.

2. A method of producing a photoelectric transducer according to claim 1, wherein the photoconductive layer is deposited on the predetermined substrate by a sputtering method and a target is placed on the second electrode so that the photoconductive layer is deposited on the substrate.

3. A method of producing photoelectric transducer according to claim 2, wherein said sputtering is reactive sputtering.

4. A method of producing a photoelectric transducer according to claim 1, wherein the photoconductive layer is deposited on the predetermined substrate by fabricating the photoconductive layer by glow discharge in an atmosphere including a gas of a raw material for forming the photoconductive layer.

5. A method of producing a photoelectric transducer according to claim 1, wherein said photoconductive layer is formed on the predetermined substrate with a negative bias potential being applied to said first electrode.

6. A method of producing a photoelectric transducer according to claim 1, 2, 3, 4 or 5, wherein said irregular surface of the predetermined substrate includes substantially flat portions and a stepped portion contiguous thereto.

7. A method of producing a photoelectric transducer according to claim 1, 2, 3, 4 or 5, wherein said negative bias potential applied to the first electrode is smaller in magnitude than a bias potential applied to said second electrode.

8. A method of producing a photoelectric transducer according to claim 1, wherein the thickness of the photoconductive film is 0.5 to 4 μm.

9. A method of producing a photoelectric transducer according to claim 8, wherein the thickness of the photoconductive film is 1.5 to 3.0 μm.

10. A method of producing a photoelectric transducer according to claim 1 or 8, wherein the thickness of the photoconductive film deposited while applying a negative bias potential to the first electrode is 0.5 to 2.0 μm.

11. A method of producing a photoelectric transducer according to claim 1, wherein the substrate comprises a semiconductor substrate having switching circuits and scanning circuits formed therein.

12. A method of producing a photoconductive layer for a photoelectric transducer on a substrate with surface irregularities including nonflat portions, comprising the steps of:
   (a) preparing, as said substrate, a semiconductor substrate including substantially flat surfaces and nonflat surfaces, said substrate being a semiconductor substrate comprising at least an impurity-doped region, an electrode contacting at least part of said impurity-doped region, and a predetermined insulating material layer thereby constituting semiconductor switch elements and interconnections therebetween for a photoelectric transducer;
   (b) placing the semiconductor substrate thus prepared on a first electrode serving as a substrate holder;
   (c) disposing a second electrode as a target in opposition to said first electrode; and
   (d) depositing a photoconductive layer on said semiconductor substrate in an atmosphere containing a plasma, with a negative bias voltage of −5 V to −300 V being applied to said first electrode, and a ratio of power to be supplied to the substrate and the target being in the range of 1/1 to 1/10, wherein the application of said negative bias voltage to said first electrode acts to sputter-etch a film deposited on said non-flat surface differentially from that on the flat surface to thereby produce a crack- and/or pinhole-free photoconductive film on said flat and non-flat surfaces.

13. The method according to claim 12, wherein a bias voltage is applied to said second electrode, with the magnitude of the bias voltage applied to said second electrode being greater than the magnitude of the bias voltage applied to said first electrode.

14. The method according to claim 12, wherein a bias voltage is applied to said second electrode, with the bias voltage ratio between the bias voltages applied to said first and second electrodes selected to be in the range of from 1/6 to 1/10, whereby the photoconductive film is formed with a more uniform thickness over the substrate surface.

15. The method according to claim 14, wherein said bias voltage ratio between the bias voltages applied to said first and second electrodes is selected to be in the range of 1/6 to 1/8.

16. The method according to claim 12, wherein a bias voltage is applied to said second electrode, with the bias voltage ratio between the bias voltages applied to said first and second electrodes being selected to approach 1/1, whereby the photoconductive film is formed with a flat surface over the substrate surface.

17. The method according to claim 12, 13, 14 or 15, wherein said photoconductive film is formed of essentially an amorphous semiconductor material.

18. The method according to claim 17, wherein said amorphous semiconductor material is amorphous silicon.

19. The method according to claim 18, wherein the amorphous silicon is hydrogenated amorphous silicon.

20. The method according to claim 12, wherein said substrate includes switching circuits and scanning circuits.

21. The method according to claim 12, wherein the thickness of said photoconductive layer deposited while a negative bias voltage is applied to said first electrode is 0.5 to 2.0 μm.

* * * * *